DETECTOR WITH UPPER AND LOWER THRESHOLD POINTS

Filed Nov. 3, 1966

INVENTOR
WILLIAM J. REAP

BY John C Black
ATTORNEY

United States Patent Office 3,487,233
Patented Dec. 30, 1969

3,487,233

DETECTOR WITH UPPER AND LOWER THRESHOLD POINTS

William J. Reap, Vestal, N.Y., assignor to International Business Machines Corporation, Armonk, N.Y., a corporation of New York Filed Nov. 3, 1966, Ser. No. 591,917
Int. Cl. H03k 5/20
U.S. Cl. 307—235 6 Claims

ABSTRACT OF THE DISCLOSURE

A first common emitter-transistor amplifier has its collector emitter electrodes connected directly across the base-emitter electrodes of a second common emitter-transistor amplifier, input signals are applied from a single source to the first transistor by way of a semiconductor device and a current limiting resistor. The input signals are also applied to the second transistor by way of a current limiting resistor. When the input signals reach a first predetermined threshold, the second transistor amplifier is turned on to saturation to produce a change in voltage at its collector output terminal. When the input signal reaches a higher second predetermined threshold, the first transistor is turned on to saturation and its emitter-to-collector voltage is sufficiently low to cause turn-off of the second transistor amplifier returning the output voltage to its initial level.

Figures 1, 3:
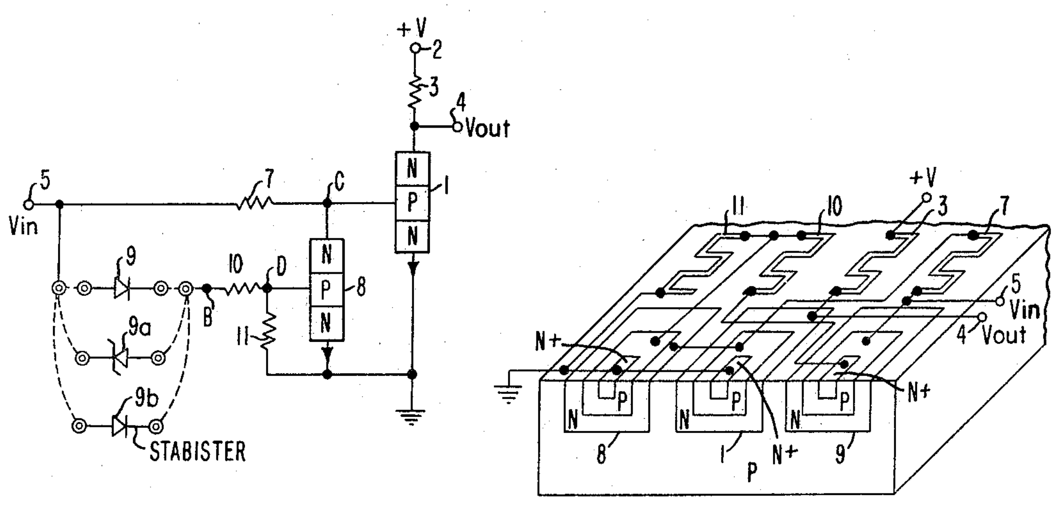

This invention relates to a simplified circuit for producing an output signal of one level between two accurately defined upper and lower voltage input levels and another output level when the input voltage is above or below said defined levels.

A need for circuits of this type arises in over voltage-under voltage detectors for power supplies and in certain types of parity check systems in data processing equipment. In many instances, two separate circuits are provided to detect the two different threshold levels and in most cases, the solution is more complex and costly than necessary.

Accordingly, it is a primary object of the present invention to provide a very simple, economical, yet reliable detector which senses well-defined upper and lower threshold limits.

In one preferred embodiment of the invention, the above object is achieved by providing a first common emitter transistor amplifier, the collector electrode of which provides the output signal of the threshold circuit. A second common emitter transistor amplifier has its collector and emitter electrodes connected respectively to the base and emitter electrodes of the first amplifier. Input signals are applied to the base electrode of the first amplifier by way of a first current limiting resistor. The input signals are also applied to the base electrode of the second amplifier by way of a series circuit including a diode and a second current limiting resistor.

Until the input signal reaches a first predetermined voltage level at which the base-emitter junction of the first amplifier becomes forward biased to its low impedance region, the first amplifier will be substantially nonconducting, whereby the collector supply potential appears at the output.

Once the first threshold level is reached, the base-emitter junction becomes forward biased; and the first amplifier is operated at saturation to apply the emitter potential to the output collector electrode. When the input signal is at this level, it is insufficient to bias both the diode and the base-emitter junction of the second amplifier to their low impedance, high current regions of operation.

However, in the event that the input signal rises to a second threshold level determined by that voltage which will forward bias both the diode and the base-emitter junction of the second amplifier to their low impedance, high current regions of operation, then the second amplifier will be turned on to its region of saturation. The second amplifier is of the type which produces at saturation a collector-emitter voltage drop which is substantially lower than the base-emitter voltage required to maintain the first amplifier conducting. As a result, the first amplifier is turned off when the second threshold level is reached, to again apply the collector supply potential to the output terminal. Thus the first amplifier is operated at saturation between the two threshold levels and at cutoff above and below said levels.

The foregoing and other objects, features and advantages of the invention will be apparent from the following more particular description of a preferred embodiment of the invention, as illustrated in the accompanying drawings.

Figure 2:
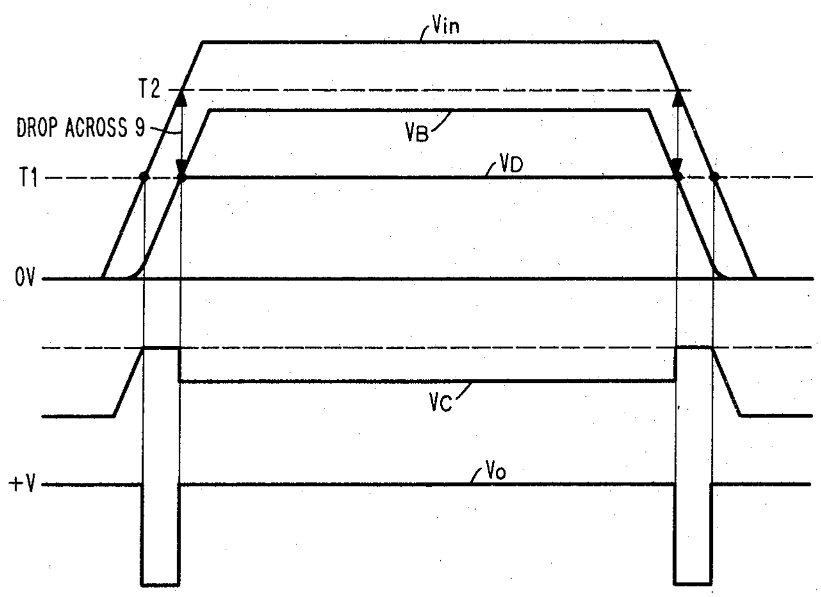

In the drawings:

FIG. 1 is a schematic circuit diagram of one preferred form of the invention;

FIG. 2 includes voltage waveforms which illustrate the operation of the embodiment of FIG. 1; and FIG. 3 diagrammatically illustrates the fabrication of the improved detector circuit on a single semiconductor chip by known monolithic fabrication techniques.

The circuit of FIG. 1 includes a first transistor amplifier 1, the emitter electrode of which is connected to ground potential and the collector electrode of which is connected to a positive supply terminal 2 by way of a resistor 3. An output terminal 4 is connected to the collector electrode. An input terminal 5 is connected to the base electrode of the amplifier by way of a resistor 7.

The input terminal is connected to the base electrode of a second transistor amplifier 8 by way of a diode 9 and a resistor 10. The collector and emitter electrodes of the amplifier 8 are connected directly to the base and emitter electrodes of the amplifier 1.

In a monolithically fabricated structure, such as shown in FIG. 3, the voltage-current characteristics of the diode 9 and the base-emitter junctions of the transistors 1 and 8 will be substantially matching, whereby the threshold levels can be well defined. The matching diode may be formed by short-circuiting the base-collector electrodes of a transistor. However, in a typical discrete component version of FIG. 1, it is not feasible to have matching devices. Hence, a resistor 11 is preferably connected across the base-emitter electrodes of the transistor 8 in a discrete component embodiment to assure well-defined threshold levels. The value of the resistor 11 is preferably large compared to the value of resistor 10 so that junctions B and D are at substantially the same voltage level. They can, however, be used as a voltage divider to further set the desired second threshold level T2. The resistor 11 provides a bias current path for the diode 9 while the amplifier 8 is substantially nonconducting.

With particular reference to FIG. 2, it will be seen that so long as the input voltage $V_{in}$ is below the threshold level line T1, both transistors 1 and 8 are operated substantially at cutoff, producing at the output the positive potential of the terminal 2.

Between the threshold levels T1 and T2, the voltage appearing at the junction C between the base of amplifier 1 and the collector of amplifier 8 has a value at which the amplifier 1 is turned on to saturation. The voltage at C becomes clamped to the base-emitter voltage drop.

When $V_{in}$ exceeds the threshold T2, the voltage at the junction D becomes sufficiently high to forward bias the amplifier 8 to saturation. The emitter-collector path of the amplifier 8 reduces the voltage at C to a value below that which is required to maintain the amplifier 1 energized; and the latter amplifier becomes substantially cut off.

Thus the output voltage $V_o$ is at its relatively positive level above and below the threshold levels T1 and T2 and is at approximately ground potential when the input signal level lies between T1 and T2.

It will be appreciated that the levels T1 and T2 are determined by the characteristics of the semiconductor devices. Assuming that the diode 9 and the base-emitter diodes of the transistors 1 and 8 are silicon devices, then their low impedance, high current conditions occur when the voltage drop across the diode is in the order of seven-tenths volt. Consequently, in such an embodiment, T1 and T2 would be approximately seven-tenths volt and one and four-tenths volts. If the circuit of FIG. 1 were modified by including an additional silicon diode between the diode 9 and the junction A, T1 and T2 would become respectively, seven-tenths volt and two and one-tenth volts.

A single germanium diode 9 would set the thresholds T1 and T2 at approximately seven-tenths volt and one volt.

Thus it will be readily apparent that many various arrangements of semiconductor devices may be arranged in accordance with the teachings of the present invention to produce upper and lower thresholds of various levels. The diode 9 can also be replaced by other devices such as a Zener diode *9a* or a stabistor *9b* to provide different threshold levels.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A threshold detector comprising only first and second common emitter transistor amplifiers each having base, emitter and collector electrodes and having the characteristic in saturation of a significantly lower emitter-to-collector voltage drop than the base-to-emitter voltage drop, a power supply having a reference terminal connected directly to the emitter electrodes of both transistors and having a second terminal of a predetermined value and polarity, an output terminal connected to the collector electrode of the first amplifier, the collector and emitter electrodes of the second amplifier being directly connected respectively to the base and emitter electrodes of the first amplifier, an input terminal, a source of input signals which vary between said reference potential and said predetermined value adapted to be connected to said input terminal, a first electrical path means resistively connected between said input terminal and said base electrode of said first amplifier for effecting energization of of first amplifier at saturation when the input signal level exceeds a first threshold level, and a second electrical path means consisting of passive elements connected between said input terminal and said base electrode of said second amplifier for effecting energization of the second amplifier at saturation when the input signal level exceeds a greater second threshold level, the emitter-to-collector saturation voltage of the second amplifier being effective to cut off the first amplifier, whereby the collector voltage of the first amplifier is at one level when the input signals are below and above the first and second threshold levels and at another level when the input signals are between said threshold level.

2. The threshold detector of claim 1 wherein the first path means comprises a first resistor coupling the input signals to the base electrode of the first amplifier, and wherein the second path means comprises at least one semiconductor device and a second resistor coupling the input signals to the base electrode of the second amplifier, and a third resistor having a value substantially larger than that of the second resistor connected across the base-emitter electrodes of the second amplifier.

3. The threshold detector of claim 2 wherein the semiconductor device is a conventional diode.

4. The threshold detector of claim 2 wherein the semiconductor device is a Zener diode.

5. The threshold detector of claim 2 wherein the semiconductor device is a stabistor.

6. The threshold detector of claim 1 wherein the first path means comprises a first resistor coupling the input signals to the base electrode of the first amplifier, wherein the second path means comprises at least one diode and a second resistor coupling the input signals to the base electrode of the second amplifier, and wherein the detector is monolithically fabricated on a single semiconductor substrate to provide the diode and the base-emitter junctions of the amplifiers with substantially matching voltage-current characteristics.

References Cited

UNITED STATES PATENTS

| | | | |
|---|---|---|---|
| 3,041,469 | 6/1962 | Ross | 307—235 |
| 3,244,910 | 4/1966 | Ceifer | 307—254 |
| 3,099,000 | 7/1963 | Dunning | 307—235 |

JOHN S. HEYMAN, Primary Examiner

D. M. CARTER, Assistant Examiner

U.S. Cl. X.R.

307—237, 254, 303, 318